United States Patent
Nakanishi et al.

(10) Patent No.: US 9,594,136 B2
(45) Date of Patent: Mar. 14, 2017

(54) MAGNETIC RESONANCE IMAGING APPARATUS AND RF PULSE CONTROL METHOD

(75) Inventors: Kenji Nakanishi, Tokyo (JP); Hiroyuki Itagaki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 1104 days.

(21) Appl. No.: 13/808,659

(22) PCT Filed: Jun. 28, 2011

(86) PCT No.: PCT/JP2011/064737
§ 371 (c)(1),
(2), (4) Date: Jan. 7, 2013

(87) PCT Pub. No.: WO2012/005137
PCT Pub. Date: Jan. 12, 2012

(65) Prior Publication Data
US 2013/0106417 A1 May 2, 2013

(30) Foreign Application Priority Data
Jul. 7, 2010 (JP) .................................. 2010-154409

(51) Int. Cl.
*G01R 33/54* (2006.01)
*G06F 17/11* (2006.01)
(Continued)

(52) U.S. Cl.
CPC ......... *G01R 33/543* (2013.01); *G01R 33/565* (2013.01); *G01R 33/5613* (2013.01); *G06F 17/11* (2013.01)

(58) Field of Classification Search
CPC .............. G01R 33/543; G01R 33/5614; G01R 33/5613; G01R 33/565
(Continued)

(56) References Cited

U.S. PATENT DOCUMENTS 7,253,620 B1 * 8/2007 Derbyshire .......... G01R 33/483
324/307
7,405,566 B2 * 7/2008 Asano ................ G01R 33/5613
324/309
(Continued)

FOREIGN PATENT DOCUMENTS

JP 2004-329268 11/2004
JP 2006-506115 2/2006
(Continued)

OTHER PUBLICATIONS

Deshpande et al. "3D Magnetization Prepared TrueFISP Using a Linear Flip Angle Series" 2002 ISMRM 10.*
International search report in corresponding PCT/JP2011/064737.

*Primary Examiner* — Melissa Koval
*Assistant Examiner* — Rishi Patel
(74) *Attorney, Agent, or Firm* — Cooper & Dunham LLP

(57) ABSTRACT

Disclosed are a magnetic resonance imaging apparatus and an RF pulse control method wherein an RF pulse sequence in a start-up sequence is set as a monotonically increasing flip angle with offset, in order to reduce ghosts, blurring, and other artifacts during measurement in a transient state. For example, the sum of two adjacent consecutive terms in a monotonically increasing sequence is set as the flip angle. Specifically, the number of RF pulses in the RF pulse sequence and the flip angle for the RF pulses in an SSFP sequence are set, and the monotonically increasing flip angle with offset is found, based on the set number of RF pulses in the RF pulse sequence and the flip angle for the RF pulses in the SSFP sequence, and used as the RF pulse sequence.

4 Claims, 11 Drawing Sheets

(51) Int. Cl.
  *G01R 33/561* (2006.01)
  *G01R 33/565* (2006.01)
(58) Field of Classification Search
  USPC .............................. 324/307, 309, 318, 322
  See application file for complete search history.

(56) References Cited

U.S. PATENT DOCUMENTS

| | | | |
|---|---|---|---|
| 2003/0160611 A1* | 8/2003 | Miyoshi | G01R 33/56308 324/306 |
| 2004/0095138 A1 | 5/2004 | Foxall | |
| 2005/0148858 A1* | 7/2005 | Hargreaves | A61B 5/055 600/410 |
| 2008/0111547 A1* | 5/2008 | Alsop | G01R 33/5617 324/309 |
| 2009/0256563 A1* | 10/2009 | Lee | G01R 33/5613 324/309 |
| 2010/0060277 A1* | 3/2010 | Nezafat | G01R 33/5635 324/309 |
| 2011/0133735 A1* | 6/2011 | Yokosawa | A61B 5/055 324/307 |

FOREIGN PATENT DOCUMENTS

| | | |
|---|---|---|
| JP | 2007-68798 | 3/2007 |
| JP | 2008-295925 | 12/2008 |
| JP | 2009-279202 | 12/2009 |

\* cited by examiner (a)

(b)

(a)

(b)

(a)

(b)

(c)

(d)

(a)

(b)

MAGNETIC RESONANCE IMAGING APPARATUS AND RF PULSE CONTROL METHOD

FIELD OF THE INVENTION

The present invention relates to a magnetic resonance imaging (hereinafter referred to as "MRI") apparatus, particularly to a technique that controls application of high-frequency magnetic field pulses for rapidly leading the magnetization to a steady state free precession.

DESCRIPTION OF RELATED ART

An MRI apparatus is capable of measuring nuclear magnetic resonance (NMR) signals produced by atomic nuclear spins that form an object to be examined, particularly human tissue, and imaging shapes or functions of the head, abdomen, limbs and the like in a 2-dimensional or 3-dimensional manner. In this imaging, different phase encoding is given to the NMR signals according to the gradient magnetic field, and frequency encoding is also given to the NMR signals. The encoded NMR signals are measured as time-series data. The measured NRR signals are reconstructed as an image by 2-dimensional or 3-dimensional Fourier transform.

In the above-described MRI apparatuses, a pulse sequence of the representative high-speed imaging method is known as SSFP sequence which measures echo signals while the magnetization is maintained in a steady state free precession (SSFP; hereinafter referred to as a steady state). In SSFP sequence, atomic nuclear spin (hereinafter abbreviated as spin) is excited by irradiating high-frequency magnetic field pulses (hereinafter referred to as RF pulses) by very short repetition time TR of about several milliseconds. Also, the excited spin tends to recover to the original thermal equilibrium state by the longitudinal relaxation and transverse relaxation. By such repetition, after passing of approximate longitudinal relaxation time (T1), the spin converges to a steady state in which the excitation and relaxation are balanced. The echo signals measured in a steady state has high SNR (Signal to Noise Ratio) but consecutive irradiation of RF pulses is necessary to reach a steady state, thus mainly applied to cardiac cine imaging, and so on.

On the other hand, the state in which the spin reaches from the thermal equilibrium state to a steady state is referred to as a transient state. In a transient state, since the excitation and relaxation are not balanced and the spin is unstable, the intensity of echo signals often oscillates. This oscillation often generates artifacts such as ghosts or blurring in reconstructed images. Given this factor, at the time of measuring echo signals in a transient state, oscillation of echo signals upon collecting echo data is suppressed by executing a start-up sequence as the preparation sequence in prior to data collecting sequence for measuring the echo signals for image reconstruction.

One of the start-up sequence methods is the α/2 method (for example, Patent Document 1). In this method, the RF pulse of a half of flip angle (α) for collecting echo data is irradiated TR/2 before the time of irradiating the first RF pulse. While the α/2 method can suppress oscillation of the spin having the same resonance frequency as the irradiation frequency of the RF pulse (hereinafter referred to as on-resonance spin), oscillation of the spin having the different resonance frequency from the irradiation frequency of the RF pulse (hereinafter referred to as off-resonance spin) cannot be sufficiently suppressed.

Another method of the start-up sequence is the Linear Flip Angle method which can effectively suppress the oscillation of the off-resonance spin (for example, Non-patent Document 1). The Linear Flip Angle method irradiates the RF pulse while linearly increasing the flip angle at certain time intervals TR as shown in the equation (1).

$$\phi(n) = a \times n (n=1,2,\ldots,N) \tag{1}$$

Here, $\phi(n)$ is the absolute value of the flip angle in the n-th RF pulse, N is the sum total of the RF pulses in the start-up sequence, and $a = \alpha/N$. In other words, flip angle $\phi(n)$ to be specified in the equation (1) is the value on the straight line in which the offset (intercept) is 0 (zero) and the gradient is $\alpha$. Actually, the RF pulse is irradiated as irradiation phase is displaced by 180 degrees, thus the flip angle is to be $\phi(n) \times (-1)^n$. Though the Linear Flip Angle method is capable of suppressing the oscillation of off-resonance spins more effectively than the $\alpha/2$ method, generation of oscillation still occurs in on-resonance spins. This oscillation can be suppressed when the total number of the RF pulses is set as a few dozen times.

PRIOR ART DOCUMENTS

Patent Documents

Patent Document 1: JP-A-H08-56932
Patent Document 2: JP-A-2004-329268

Non-Patent Documents

Non-Patent Document 1: V. S. Deshpande, et al., ISMRM 10, p 1586 (2002)

Technical Problems

In the Linear Flip Angle method, when the total number of RF pulses in the start-up sequence is small, the echo signal of not only the off-resonance spin but also of the on-resonance spin oscillates. Especially when measurement of the echo signal to be used for image reconstruction has to be started right after applying a few times of dummy RF pulses such as the K-space scanning of centric ordering, the echo signal has to be measured in the state that the oscillation remains. As a result, artifacts such as ghosts or blurring could be generated in an image.

Considering the above-described problems, the objective of the present invention is to reduce oscillation of echo signals even when the total number of RF pulses in the start-up sequence which lead the magnetization to be in a steady state is small, so as to avoid generation of artifacts such as ghosts or blurring in an image.

BRIEF SUMMARY OF THE INVENTION

In order to achieve the above-described objective, the present invention sets the RF pulse sequence of the start-up sequence as the flip angle which monotonically increases with offset. For example, the sum of the two adjacent terms in the monotonically increasing sequence is set as the flip angle.

In concrete terms, the MRI apparatus of the present invention comprises:

a calculation processing unit configured to generate an imaging sequence formed by a start-up sequence for suppressing the oscillation of spins in a transient state by the RF pulse sequence in which the flip angle monotonically increases and a SSFP sequence for measuring the echo signal in a steady state; and a measurement control unit configured to control measurement of the echo signal from an object based on the imaging sequence, wherein the RF pulse sequence is that of which the flip angle monotonically increases with offset.

Also, the RF pulse control method of the present invention is characterized in including steps of:

setting the number of RF pulses in an RF pulse sequence and the flip angle of the RF pulse in the SSFP sequence; and flip angle calculation that obtains the flip angles which monotonically increases with offset based on the set number of RF pulses in the RF pulse sequence and the flip angle of RF pulses in the SSFP sequence and sets the obtained flip angles as the RF pulse sequence.

Advantageous Effects of Invention

In accordance with the MRI apparatus and RF pulse control method of the present invention, it is possible to obtain high quality images without artifacts such as ghosts or blurring by reducing the oscillation of echo signals even when the total number of RF pulses in the start-up sequence for leading the magnetization to a steady state is small.

DETAILED DESCRIPTION OF THE INVENTION

Figure 1:
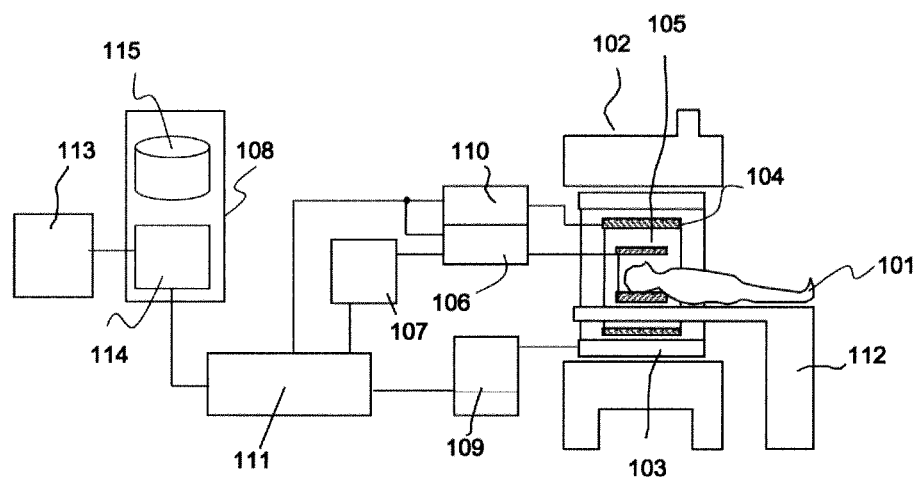
FIG. 1 is a block diagram showing the general configuration of the MRI apparatus to which the present invention is applied.

The preferable embodiments of the MRI apparatus related to the present invention will be described below in detail referring to the attached drawings. In all drawings for explaining embodiments of the present invention, the same function parts are represented by the same reference numerals, and the duplicative description thereof is omitted.

First, the MRI apparatus related to the present invention will be described referring to FIG. 1. FIG. 1 is a block diagram showing the general configuration of an embodiment of the MRI apparatus related to the present invention.

This MRI apparatus is for obtaining tomographic images of an object 101 using NMR phenomenon, which comprises a static magnetic field generating magnet 102, a gradient magnetic field coil 103 and a gradient magnetic field source 109, an RF transmission coil 104 and an RF transmission unit 110, an RF reception coil 105 and a signal detection unit 106, a signal processing unit 107, a measurement control unit 111, an overall control unit 108, a display/operation unit 113, and a bed 112 for carrying a top board on which an object 101 is placed in and out to/from the inside of the static magnetic field generating magnet 102 as shown in FIG. 1.

The static magnetic field generating magnet 102 generates uniform static magnetic field respectively in the direction orthogonal to the body axis of the object 101 if the magnet is of the vertical magnetic field method and in the body-axis direction if the magnet is of the horizontal magnetic field method, and is provided with a static magnetic field generating source of the permanent magnet type, normal conductive type or superconductive type around the object 101.

The gradient magnetic field coil 103 is wound in the three-axis directions of X, Y and Z which are the actual space coordinate system (coordinate system at rest) of the MRI apparatus, and the respective gradient magnetic field coils are connected to the gradient magnetic field source 109 which activates the coils and supplies electric current. In concrete terms, the gradient magnetic field source 109 of the respective gradient magnetic field coils is activated respectively by the command from the measurement control unit 111 to be described later, and provides electric current to the respective gradient magnetic field coils. In this manner, gradient magnetic fields Gx, Gy and Gz are generated in the three-axis directions of X, Y and Z.

At the time of imaging a 2-dimensional slice plane, a slice plane with respect to the object 101 is set by applying a slice gradient magnetic field pulse (Gs) in the direction orthogonal to the slice plane (imaging plane), phase encode gradient magnetic field pulse (Gp) and frequency encode (readout) gradient magnetic field pulse (Gf) are applied in the remaining two directions that are orthogonal to the slice plane and to each other, and the positional information in the respective directions are encoded to the NMR signal (echo signal).

The RF transmission coil 104 is for irradiating an RF pulse to the object 101, connected to the RF transmission unit 110 and supplied with high-frequency pulse current. In this manner, the NMR phenomenon is excited on the spin of atomic elements that form biological tissue of the object 101. In concrete terms, the RF transmission unit 110 is activated according to the command from the measurement control unit 111 to be described later, and a high-frequency pulse is amplitude-modulated, and the amplified pulse is provided to the RF transmission coil 104 which is placed near the object 101, for irradiating an RF pulse to object 101.

The RF reception coil 105 receives the echo signal emitted by the NMR phenomenon of the spins that form the biological tissue of the object 101 and is connected to the signal detection unit 106, and the received echo signal is transmitted to the signal detection unit 106.

The signal detection unit 106 detects the echo signal received in the RF reception coil 105. In concrete terms, the responsive echo signal of the object 101 which is excited by the RF pulse irradiated from the RF transmission coil 104 is received by the RF reception coil 105 that is placed near the object 101, the signal detection unit 106 amplifies the received echo signal according to the command from the measurement control unit 111 to be described later and divides the echo signal into two series of signals that are orthogonal to each other by quadrature detection, performs sampling on the respective signals for predetermined numbers (for example, 128, 256, 512, etc.), performs A/D conversion on the respective sampling signals into digital quantity, and transmits them to the signal processing unit 107 to be described later. Thus, the echo signal is obtained as time series digital data (hereinafter referred to as echo data) formed by predetermined numbers of sampling data sets.

The signal processing unit 107 performs various processing on the echo data, and transmits the processed echo data to the measurement control unit 111.

The measurement control unit 111 transmits various commands for collecting echo data which is necessary for reconstruction of tomographic images of the object 101 mainly to the gradient magnetic field source 109, the RF transmission unit 110 and the signal detection unit 106 for controlling the these components. In concrete terms, the measurement control unit 111 is operated under control of a general control unit 108 to be described later and controls collection of echo data necessary for image reconstruction of imaging regions in the object 101 by controlling the gradient magnetic field source 109, the RF transmission unit 110 and the signal detection unit 106 on the basis of a predetermined pulse sequence and repeatedly executing irradiation of RF pulses and application of gradient magnetic field pulses to the object 101 and detection of the echo signal from the object 101. At the time of repeating application of pulses, the application amount of phase encode gradient magnetic field should also be changed for 2-dimensional imaging, and the application amount of slice encode gradient magnetic field should be changed for 3-dimensional imaging. The number of phase encodes to be selected per image is generally 128, 256, 512, and so on, and the number of slice encodes to be selected is generally 16, 32, 64, and so on. Under such control, the echo data from the signal processing unit 107 is output to the general control unit 108.

The general control unit 108 controls the measurement control unit 111, various data processing, display and storage of processing results, etc., and comprises a calculation processing unit 114 in which a CPU and a memory are contained and a storage unit 115 which is a device such as an optical disk or a magnetic disk. In concrete terms, when the measurement control unit 111 is controlled to collect the echo data and the echo data from the measurement control unit 111 is input, the calculation processing unit 114 causes the echo data to be stored in the portion equivalent to the k-space in the memory on the basis of the encoding information applied to the echo data. The echo data group stored in the portion equivalent to the K-space in the memory is also referred to as K-space data. Then the calculation processing unit 114 executes the signal processing or processing such as image reconstruction by the Fourier transform, and causes the images of the object 101 which are the processing result to be displayed on the display/operation unit 113 to be described later and stored in the storage unit 115.

The display/operation unit 113 is formed by a display unit configured to display the reconstructed images of the object 101 and an operation unit such as a trackball, a mouse or a keyboard configured to input various control information of the MRI apparatus or the control information of the processing to be executed under control of the above-described general control unit 108. This operation unit is placed in the vicinity of the display unit, and an operator interactively controls various processing of the MRI apparatus via the operation unit while observing the display unit.

Currently an imaging target nuclear species of MRI apparatuses which is clinically in widespread use is hydrogen nucleus (proton) that is the main constituent of an object. By imaging the information on the spatial distribution of the proton density or the spatial distribution of the relaxation time in an excited state, the shapes or functions of a human head, abdomen, limbs and so on are 2-dimensionally or 3-dimensionally imaged.

Embodiment 1

Next, the first embodiment of the MRI apparatus and the RF pulse control method related to the present invention will be described. The present embodiment controls the respective flip angles of the RF pulse sequence that forms the start-up sequence such that the offset (intercept) becomes the value which is other than 0 (zero) on the straight line. The present embodiment will be described below in detail referring to FIG. 2~ FIG. 9.

First, the outline of control in the present embodiment regarding the flip angle of the respective RF pulses in the start-up sequence will be described.

Figure 2:
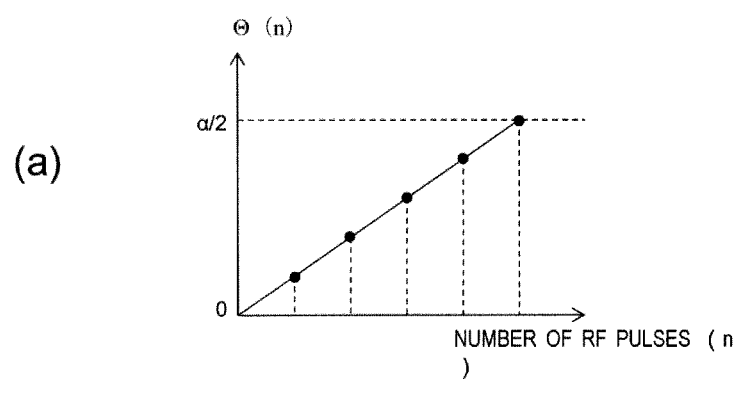
FIG. 2 shows a monotonically increasing sequence (a) in a first embodiment and a flip angle (b) of the RF pulse sequence based on the monotonically increasing sequence.
Figure 2:
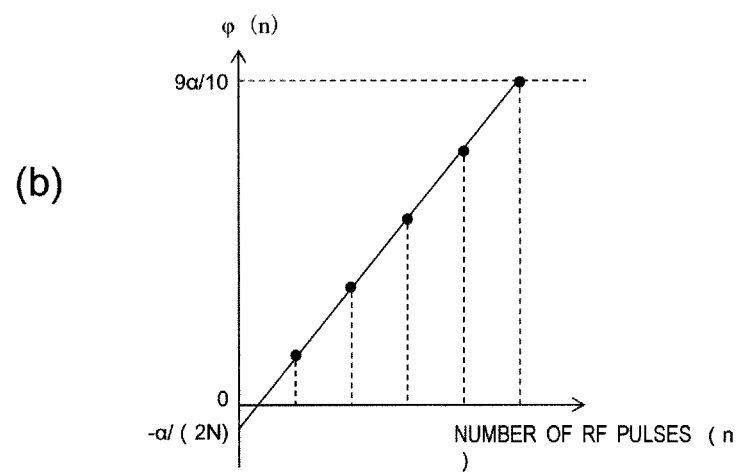

As shown in FIG. 2, sequence $\Theta(n)$ is created which linearly increases between 0 and $\alpha/2$. That is, the arithmetic progression is created with first term 0 and tolerance $\alpha/(2N)$.

$$\Theta(n)=(\alpha/(2N))\times n(n=1,2,\ldots,N) \quad (2)$$

Here, $\alpha$ is the flip angle of the SSFP sequence at the time of collecting echo data, and N is the number of RF pulses in the start-up sequence. For example, when N is five times, the flip angles are $\alpha/10$, $2\alpha/10$, $3\alpha/10$, $4\alpha/10$, and $5\alpha/10(=\alpha/2)$. This $\Theta(n)$ is the absolute value of the angle made by an on-resonance spin and the Mz-axis, after the n-th RF pulse is irradiated, at a limit where longitudinal relaxation time T1 and transverse relaxation time T2 are sufficiently longer compared to repetition time TR and the relaxation process can be disregarded.

With that, absolute value $\phi(n)$ of the flip angle in the n-th RF pulse from $\Theta(n)$ is calculated according to the following equation (3).

$$\phi(n)=\Theta(1) \text{ when } n=1,$$

$$\phi(n)=\Theta(n)+\Theta(n-1) \text{ when } 2\leq n\leq N \quad (3)$$

When the equation is solved by assigning the equation (3) to the equation (2), the result will be as seen in the following equation (4).

$$\phi(n)=a\times n+b(n=1,2,\ldots,N) \quad (4)$$

Here, gradient:$a=\alpha/N$, and offset (intercept):$b=-\alpha/(2N)$. FIG. 2(b) shows an example of a straight line expressed by the equation (4) in the case that N=5. That is, the flip angle of the respective RF pulses in the RF pulse sequence which form the start-up sequence of the present embodiment is the value on the straight line in which the offset (intercept) is not 0 (zero), and the flip angle monotonically increases along this straight line at each irradiation of RF pulses. It is the same as the conventional Linear Flip Angle method in that the flip angle monotonically increases, but different in that offset b exists in the flip angle control of the present embodiment as shown in the equation (4) while no offset exists in the absolute value of the flip angle in the conventional Linear Flip Angle method as shown in the equation (1).

Actually, since the respective RF pulses are irradiated as displacing the irradiation phase by 180 degrees, the flip angle of the n-th RF pulse is as expressed in the equation (5).

$$\phi(n) = \{a \times n + b\} \times (-1)^n \quad (n=1,2,\ldots,N) \qquad (5)$$

Figure 3:
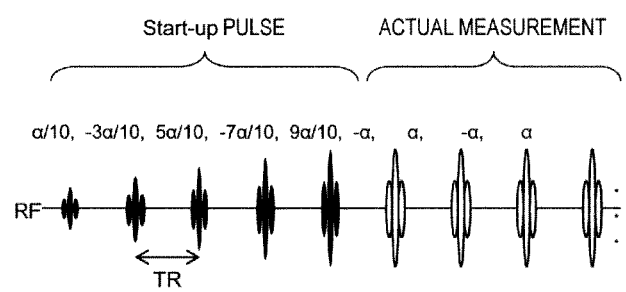
FIG. 3 shows a flip angle of the RF pulse sequence in the start-up sequence when N is five times.

For example, when N is five times, the flip angles in the RF pulse sequence of the start-up sequence are $\alpha/10$, $-3\alpha/10$, $5\alpha/10$, $-7\alpha/10$, and $9\alpha/10$ as shown in FIG. 3. Further, when $\alpha=90$ degrees, the flip angle becomes 9 deg., −27 deg., 45 deg., −63 deg., and 81 deg. On the contrary, the flip angle of the conventional Linear Flip Angle method shown in the equation (1) becomes 18 deg., −36 deg., 54 deg., −72 deg., and 90 deg. in the same condition. In FIG. 3, the gradient magnetic field pulse waveform is omitted. The detailed description on the gradient magnetic field waveform will be omitted here, since the pulse sequence disclosed in, for example Patent Document 2 can be used.

Figure 4:
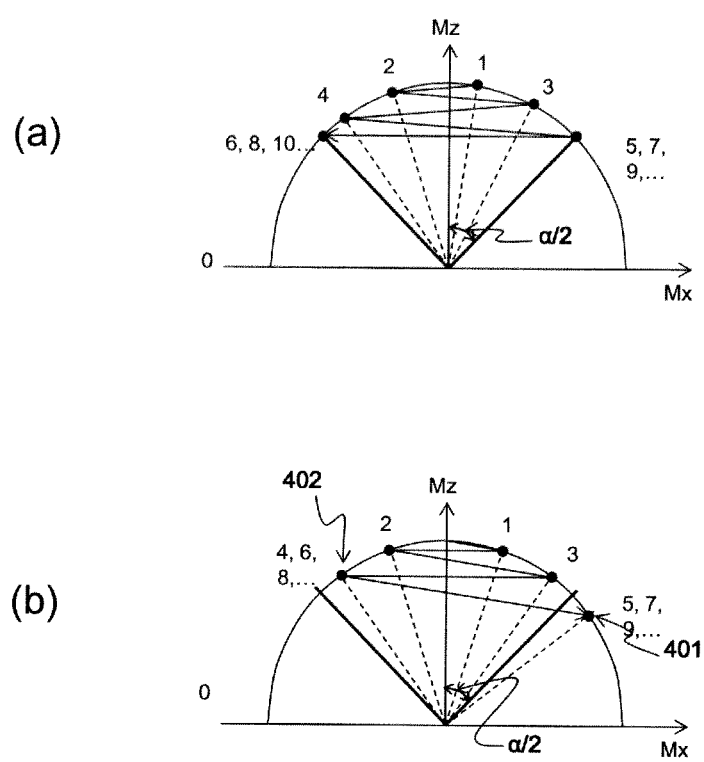
FIG. 4 shows the behavior of on-resonance spin. (a) shows the case in which the start-up sequence in FIG. 3 is used, and (b) shows the case in which the conventional Linear Flip Angle method is used.

FIG. 4 shows the behavior of an on-resonance spin in the case of using a start-up sequence. FIG. 4(a) shows the case of using the start-up sequence in the present embodiment, and FIG. 4(b) shows the case of using the conventional Linear Flip Angle method for comparison. Both drawings show the behavior of the spin on the Mx-Mz plane in the case of executing the start-up sequence formed by the RF pulse sequence in which N=5 and $\alpha=90$ degrees, assuming the limit where longitudinal relaxation time T1 and transverse relaxation time T2 are sufficiently longer compared to repetition time TR and the relaxation process can be disregarded, and the numeric values in the diagram indicate the number of RF pulse irradiations. The flip angles of the RF pulse in the present embodiment shown in (a) are 9 deg., −27 deg., 45 deg., −63 deg., and 81 deg., and the flip angles of the RF pulse in the conventional Linear Flip Angle method shown in (b) are 18 deg., −36 deg., 54 deg., −72 deg., and 90 deg.

As shown in FIG. 4, while the on-resonance spin to which the start-up sequence of the present embodiment is applied makes movement alternately with the Mz-axis therebetween for each application of RF pulse, since the angle made between the spin and the Mz-axis becomes exactly $\alpha/2$ at the end of start-up sequence, the oscillation of the echo signal can be suppressed. On the contrary, the on-resonance spin to which the start-up sequence of the conventional Linear Flip Angle method is applied makes movement alternately with the Mz-axis therebetween for each application of RF pulses and oscillates between 401 and 402 at the end of the start-up sequence, thus the echo signal is also oscillated.

Figure 5:
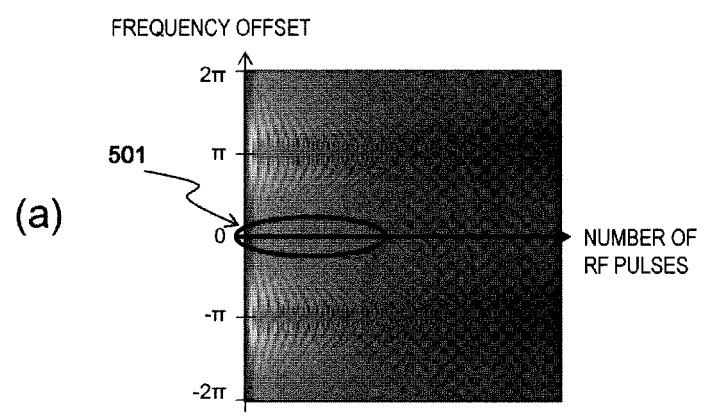
FIG. 5 shows the behavior of off-resonance spin. (a) shows the case in which the start-up sequence in FIG. 3 is used, and (b) shows the case in which the conventional Linear Flip Angle method is used.
Figure 5:
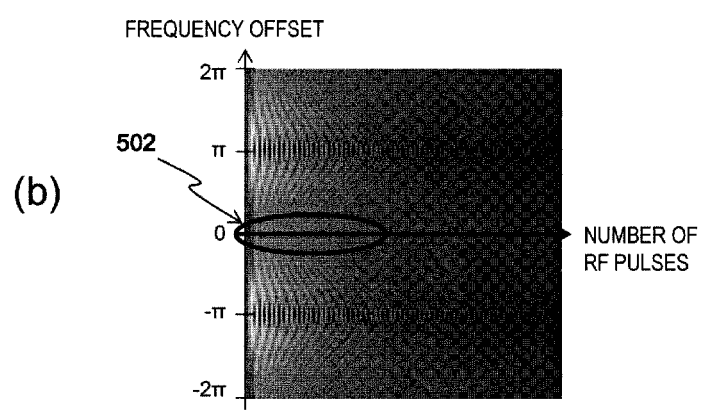

FIG. 5 shows the result of numerical calculation of the oscillation regarding the off-resonance spin in a transient state. In FIG. 5, the spin of which the longitudinal axis is zero is defined as "on-resonance", and the other spin is defined as "off-resonance" (it is the same also in FIG. 11 to be described later). FIG. 5(a) shows the case of using the start-up sequence in the present embodiment, and FIG. 5(b) shows the case of using the conventional Linear Flip Angle method for comparison. In both drawings, the lateral axis indicates the number of RF pulse irradiations, the longitudinal axis indicates the offset frequency between repetition times TR, and the absolute value of the transverse magnetization is displayed by gray scale. The parameters used for the numerical calculation are T1=1200 ms, T2=250 ms, FA=90 deg., TR=4.0 ms and N=5.

In the case that the conventional Linear Flip Angle is used as shown in FIG. 5(b), the spin having a small displacement from the irradiation frequency of the RF pulse such as a region 502 (off-resonance spin) is oscillated, while the oscillation is sufficiently suppressed near an on-resonance spin 501 as shown in FIG. 5(a) in the case of using the start-up sequence in the present embodiment.

Figure 6:
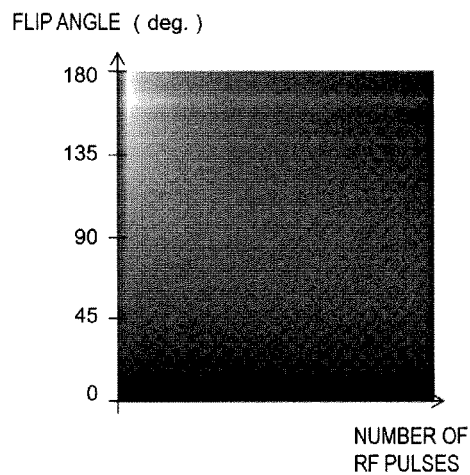
FIG. 6 shows the result of numerical calculation of the flip angle dependence in the oscillation in a transient state with respect to the on-resonance spin, in the case that the start-up sequence is used. (a) and (b) show the case in which the start-up sequence in FIG. 3 is used, and (c) and (d) show the case in which the conventional Linear Flip Angle method is used.
Figure 6:
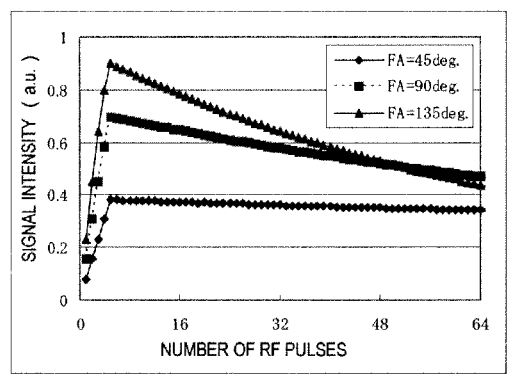
Figure 6:
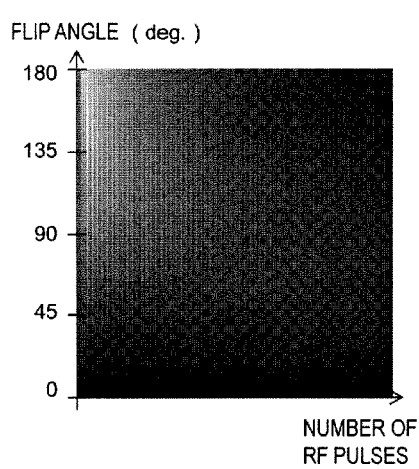
Figure 6:
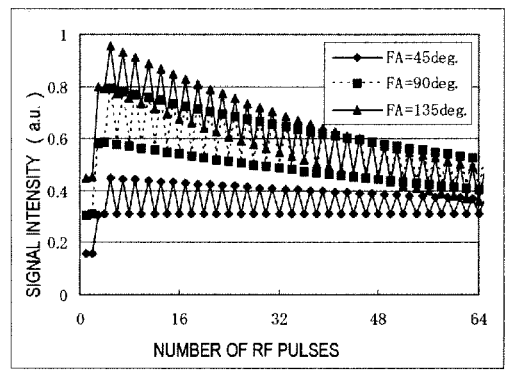

FIG. 6 shows the result of numerical calculation regarding the flip angle dependency of the oscillation in a transient state with respect to the on-resonance spin in the case of using the start-up sequence. The case of using the start-up sequence in the present embodiment is shown in (a) and (b), and the case of using the conventional Linear Flip Angle method is shown in (c) and (d) for comparison. The lateral axis in (a) and (b) indicates the number of RF pulses and the longitudinal axis indicates the flip angle. The absolute value of the transverse magnetization is displayed by a gray scale as in FIG. 5. The parameters used for the numerical calculation are the same as in FIG. 5.

The absolute values of the transverse magnetization in the number of respective RF pulses are shown in (b) and (d) in relation to the spins having the flip angle FA of 45 deg., 90 deg. and 135 deg. respectively from (a) and (c). In the Linear Flip Angle method of (d), the spins having the flip angle of 45 deg., 90 deg. and 135 deg are oscillated. On the other hand, in the start-up sequence of the present embodiment shown in (b), there is no indication of oscillation. The same tendency is recognized in any arbitrary flip angle, thus it is understandable in (a) and (c) that the oscillation of echo signals in any flip angle can be suppressed in the start-up sequence of the present embodiment and that echo signals still oscillate in any flip angle when the conventional Linear Flip Angle method is used. Accordingly, it is possible to suppress the oscillation by using the start-up sequence in the present embodiment even when the displacement occurred in the flip angle due to nonuniformity in irradiation.

While the on-resonance spin is exemplified in FIG. 6 for simplicity in showing the numerical calculation result, the oscillation of the off-resonance spins can also be sufficiently suppressed in the vicinity of the on-resonance area using the start-up sequence in the present embodiment as in FIG. 5.

Also, while the first term of $\Theta(n)$ is set as 0 in the present embodiment, any value can be set for suppressing the oscillation.

Figure 7:
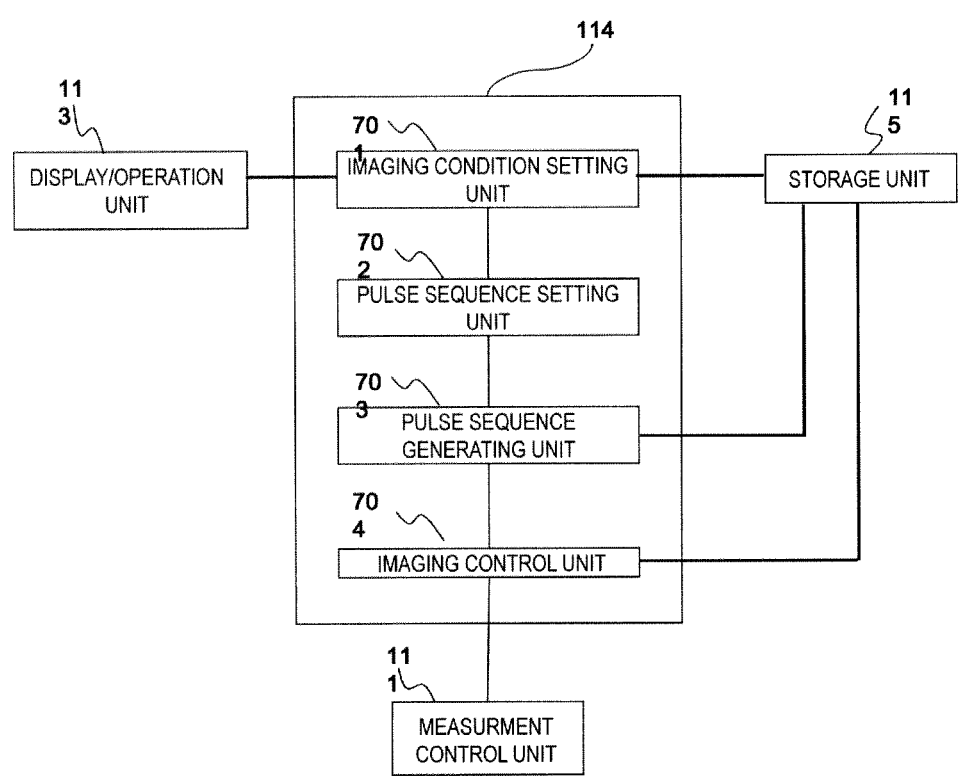
FIG. 7 shows the functional block of the calculation processing unit in the first embodiment.

Next, the respective functions of the calculation processing unit 114 configured to acquire the flip angle of the respective RF pulses that form the start-up sequence in the above-described present embodiment and activates the SSFP sequence including the start-up sequence will be described referring to the function block diagram shown in FIG. 7. The calculation processing unit 114 of the present embodiment comprises an imaging condition setting unit 701, an RF pulse sequence setting unit 702, a pulse sequence setting unit 703 and an imaging control unit 704.

Figure 9:
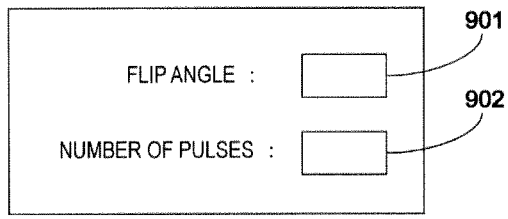
FIG. 9 is an example of a screen for inputting imaging conditions.

The imaging condition setting unit 701 is connected to the display/operation unit 113 and the storage unit 115, and causes an input screen which receives the input of imaging condition setting (i.e. values of imaging parameters) to be displayed on the display unit. An operator sets the imaging conditions via this input screen. FIG. 9 shows an example of the input screen. In this input screen, areas are displayed including at least flip angle $\alpha$ (901) in the SSFP sequence which is the data collecting sequence, the number of RF pulses N (902) in the RF pulse sequence of the start-up sequence which is the preparation sequence prior to collecting echo data, and the areas to receive input of the values thereof for each imaging condition. The operator inputs the value of the respective imaging conditions via an operation unit. Then the imaging condition setting unit 701 stores the values of various imaging conditions input by the operator in a memory as the set values of the various imaging conditions. In addition, predetermined values stored in the storage unit 115 may also be used for the flip angle α and N for the number of RF pulses.

The RF pulse sequence setting unit 702 is connected to the imaging condition setting unit 701, calculates and sets the flip angle of the RF pulse sequence in the start-up sequence based on the input imaging conditions. The RF pulse sequence setting unit 702 creates arithmetic progression Θ(n) on the basis of the equation (2) using the flip angle α and N which is the number of RF pulses that are input by the operator and stored in the memory or read cut from the storage unit 115, and calculates absolute value φ(n) of the flip angle in the n-th RF pulse based on the equation (3) using the generated arithmetic progression Θ(n). Or, absolute value φ(n) of the flip angle in the n-th RF pulse may also be directly calculated using the equation (4).

The pulse sequence generating unit 703 is connected to the RF pulse sequence setting unit 702 and the storage unit 115, and generates a pulse sequence by acquiring concrete data for setting the condition such as the application timing of the RF pulse or the gradient magnetic field pulse on the basis of the imaging conditions input by the operator and stored in the memory. Since the pulse sequence in the present embodiment is formed by the start-up sequence as the preparation sequence and the SSFP sequence as the data collecting sequence, the pulse sequence setting unit 703 generates concrete data for continually executing these two pulse sequences respectively. In concrete terms, data of the start-up sequence is in relation to the RF pulse or the gradient magnetic field pulse which concretely regulates the RF pulse sequence of the flip angle, expressed in the equation (5), to which the irradiation phase is given to the flip angle set in the RF pulse sequence setting unit 702. Also, data of the SSFP sequence is related to the RF pulse or the gradient magnetic field pulse which regulate the measurement of echo signals for image reconstruction by irradiation of the RF pulse with the flip angle α.

The imaging control unit 704 is connected to the pulse sequence generating unit 703, the storage unit 115 and the measurement control unit 111, and configured to inform the concrete data of the pulse sequence generated in the pulse sequence generating unit 703 to the measurement control unit 111 and causes the measurement control unit 111 to execute the pulse sequence, for starting the imaging.

Next, the processing flow of the present embodiment in which the respective functions of the above-described calculation processing unit 114 are linked and executed will be described referring to the flowchart shown in FIG. 8.

In step 801, the imaging condition setting unit 701 displays on the display unit the input screen which receives the input of imaging condition setting. The operator inputs and sets the imaging condition via the input screen. Or, the imaging condition setting unit 701 reads in the values of the imaging conditions that are previously stored in the storage unit 115. Then the imaging condition setting unit 701 stores the values of the various imaging conditions that are input or read in to the memory of the calculation processing unit 114.

In step 802, the RF pulse sequence setting unit 702 calculates the flip angle of the RF pulse sequence in the start-up sequence based on the values of the imaging conditions stored in the memory in step 801 and stores the calculated flip angle to the memory of the calculation processing unit 114.

In step 803, the pulse sequence generating unit 703 acquires concrete data for regulating the flip angle of the RF pulse, the shape of the gradient magnetic field pulse, the application timing thereof, etc. based on the values of imaging condition stored in the memory in step 801 and the flip angle of the RF pulse sequence in the start-up sequence stored in the memory in step 802, and generates the concrete data for continually executing the start-up sequence and the SSFP sequence.

In step 804, the imaging control unit 704 informs the measurement control unit 111 of the concrete data of the pulse sequence generated by the pulse sequence generating unit 703 in step 803, and executes the pulse sequence generated in the measurement control unit 111, so as to start the imaging.

The processing flow of the present embodiment has been described above.

As described above, the MRI apparatus and the RF pulse control method of the present embodiment linearly increases the flip angle of the respective RF pulses that form the RF pulse sequence in the start-up sequence with appropriate offset. In this manner, oscillation of the on-resonance spin can be suppressed. Therefore, it is possible to obtain high quality images without artifacts such as ghosts or blurring by reducing the oscillation of echo signals even when the total number of RF pulses in the start-up sequence for leading the magnetization to a steady state is small. That is, echo data collection can be started by applying a small number of dummy RF pulses.

Embodiment 2

Figure 10:
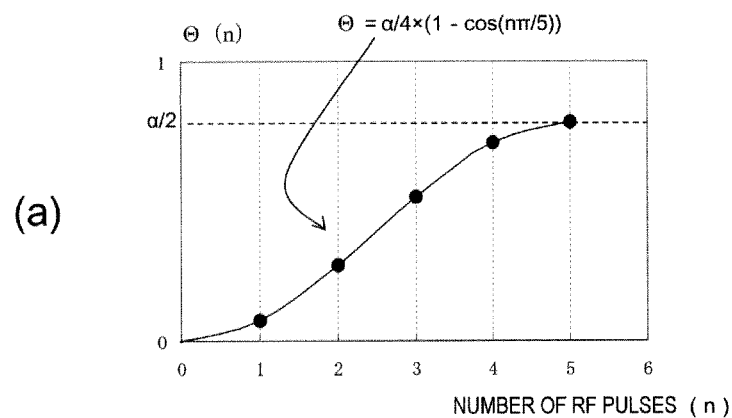
FIG. 10 shows a monotonically increasing sequence (a) in a second embodiment and a flip angle (b) of the RF pulse sequence based on the monotonically increasing sequence.
Figure 10:
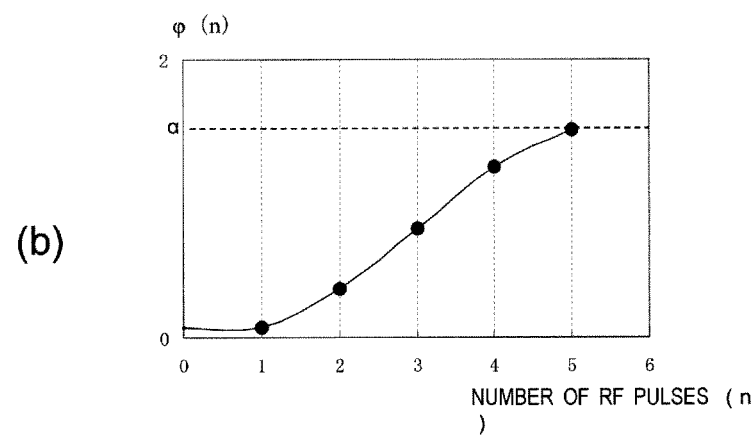

Next, the second embodiment of the MRI apparatus and the RF pulse control method of the present invention will be described. The present embodiment determines the respective flip angles in the RF pulse sequence of the start-up sequence using the sequence which changes smoothly at the start-up and the tangent point to the straight line of α/2, i.e. the sequence in which the difference between the adjacent two terms monotonically increases and then monotonically decreases. The present embodiment will be described in detail referring to FIGS. 10 and 11.

While sequence Θ is created on the basis of the straight line which connects two points of 0 and α/2 in the previously described first embodiment, the sequence can be generally created by any monotonically increasing sequence. Given this factor, as the result of numerical calculations by changing monotonically increasing sequences in various ways, the present inventor found that the oscillation of echo signals can be suppressed with respect to a wider offset frequency by determining the respective flip angles of the RF pulse sequence in the start-up sequence using the sequence which smoothly changes at the start-up and the tangent point to the straight line of /2, i.e. the sequence in which the difference between the adjacent two terms monotonically increases and then monotonically decreases. An example of such sequence is, $$\Theta(n)=\alpha/4\times(1-\cos(n\pi/N)) \qquad (6).$$

This sequence is shown in FIG. 10(a). When the recurrence equation is solved according to the equation (3) with respect to the sequence in the equation (6), $$\phi(n)=\alpha/2\times(1-\beta\times\cos(n\pi/N-\gamma)),\ n=1,2,\ldots,N \qquad (7).$$

Here, $\beta^2=(1+\cos(\pi/N))/2$, $\sin(\gamma)=\sin(\pi/N)\pi/2\beta$, and $\cos(\gamma)=(1+\cos(\pi/N))/2\beta$. An example of the curve expressed in the equation (7) in the case that N=5 is shown in FIG. 10(b). In practice, since the respective RF pulses are irradiated as displacing the irradiation phase by 180 degrees, the flip angle of the n-th RF pulse can be expressed as equation (5).

Figure 11:
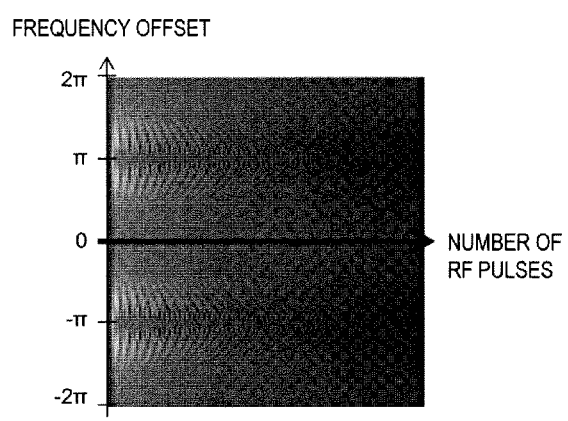
FIG. 11 shows the result of numerical calculation of the oscillation in a transient state with respect to the off-resonance spin, in the case that the start-up sequence in FIG. 10 is used.

In accordance with the start-up sequence of the RF pulse sequence having such flip angle, the oscillation of the echo signal in a transient state can be suppressed with respect to on-resonance spins as in the first embodiment. FIG. 11 shows the result of numerical calculation of the oscillation in an echo signal in a transient state with respect to the off-resonance spin (spins having the longitudinal axis of other than zero in FIG. 11). The coordinate axis and the method of numerical calculation are the same as in FIG. 5(a). When FIG. 5(a) and FIG. 11 are compared, it can be recognized that the oscillation can be controlled with respect to a wider frequency offset in FIG. 11. FIG. 11 shows that the oscillation in the on-resonance spins (the spin in which the longitudinal axis is zero) are also being suppressed.

Next, the respective functions of the calculation processing unit 114 will be described which acquires the flip angle of the respective RF pulses in the start-up sequence of the above-described present embodiment and activates the SSFP sequence including the start-up sequence. The respective functions of the calculation processing unit 114 in the present embodiment are the same as in the previously described first embodiment shown in FIG. 7, but the processing content of the RF pulse sequence setting unit 702 is different. Only the difference will be described below and the same function parts will be omitted.

The RF pulse setting unit 702 of the calculation processing unit 114 in the present embodiment creates arithmetic processing $\Theta(n)$ on the basis of the equation (6), and calculates absolute value $\phi(n)$ of the flip angle in the n-th RF pulse based on the equation (3) using the generated arithmetic processing $\Theta(n)$. Or, absolute value $\phi(n)$ of the flip angle in the n-th RF pulse can be directly calculated using the equation (7).

Figure 8:
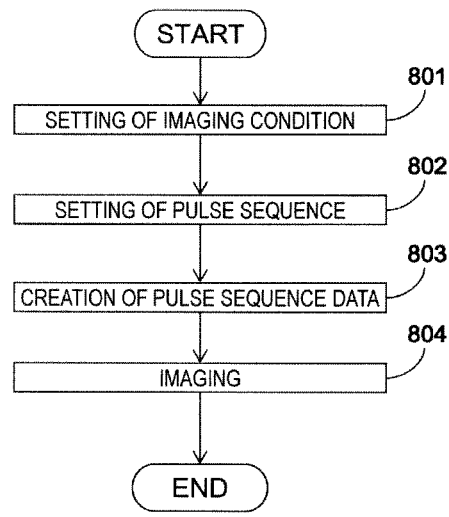
FIG. 8 is a flowchart showing the operation flow of the functional block in the calculation processing unit of the first embodiment.

The processing flow in the present embodiment to be executed by the respective operation parts of the calculation processing unit 114 will be omitted since it is the same as the processing flow in the previously described first embodiment shown in FIG. 8.

As described above, the MRI apparatus and the RF pulse control method in the present embodiment uses the start-up sequence which has the RF pulse sequence of the flip angle calculated by the equation (3) on the basis of the sequence that smoothly changes at the start-up and the tangent point to the straight line of $\alpha/2$. In this manner, it is possible not only to suppress the oscillation of the on-resonance spin, but also the oscillation of the off-resonance spin in relation to the wider range of frequency offset. Therefore, as in the first embodiment, high-quality images can be obtained without artifacts such as ghosts or blurring by reducing the oscillation of echo signals even when the sum of the RF pulses in the start-up sequence for leading the magnetization to a steady state is small.

DESCRIPTION OF REFERENCE NUMERALS 1 object
2 static magnetic field generation system
3 gradient magnetic field generation system
4 sequencer
5 transmission system
6 reception system
7 signal processing system
8 central processing unit (CPU)
9 gradient magnetic field coil
10 gradient magnetic field source
11 high-frequency oscillator
12 modulator
13 high-frequency amplifier
14a high-frequency coil (transmission coil)
14b high-frequency coil (reception coil)
15 signal amplifier
16 quadrature detector
17 A/D converter
18 magnetic disk
19 optical disk
20 display
21 ROM
22 RAM
23 Trackball or mouse
24 Keyboard

The invention claimed is:

1. A magnetic resonance imaging apparatus comprising:
a calculation processing unit configured to generate an imaging sequence formed by a start-up sequence for suppressing the oscillation of spins in a transient state by an RF pulse sequence of which flip angle $\phi(n)$ (n=1, 2, ..., N; N being number of RF pulses in the RF pulse sequence) monotonically increases and an SSFP sequence for measuring echo signals in a steady state; and
a measurement control unit configured to control measurement of the echo signals from an object to be examined on basis of the imaging sequence,
wherein the RF pulse sequence is that of which the flip angle monotonically increases with offset, and
wherein the n-th flip angle $\phi(n)$ in the RF pulse sequence is expressed by:

$\phi(n)=\alpha/2\times(1-\beta\times\cos(n\pi/N-\gamma))$, $\beta^2=(1+\cos(\pi/N))/2$, $\sin(\gamma)=\sin(\pi/N)/2\beta$ or $\cos(\gamma)=(1+\cos(\pi/N))/2\beta$, where $\alpha$ is flip angle of the SSFP sequence.

2. The magnetic resonance imaging apparatus according to claim 1, wherein the offset is the value which changes according to the flip angle ($\alpha$) of the RF pulse in the SSFP sequence and the number of RF pulses (N) in the RF pulse sequence.

3. The magnetic resonance imaging apparatus according to claim 2, further comprising input means configured to receive input of the flip angle ($\alpha$) of the RF pulse in the SSFP sequence and the number of RF pulses (N) in the RE pulse sequence.

4. An RF pulse control method for an imaging sequence formed by a start-up sequence for suppressing oscillation of spins in a transient state by an RF pulse sequence of which flip angle $\phi(n)$ (n=1, 2, ..., N; N being number of RF pulses in the RF pulse sequence) monotonically increases and an SSFP sequence for measuring echo signals in a steady state, including steps of:
setting the number N of RF pulses in the RF pulse sequence and flip angle $\alpha$ of the SSFP sequence;
calculating for the RF pulse sequence the flip angle that monotonically increases with offset on the basis of the number N of RF pulses in the set RF pulse sequence and the flip angle $\alpha$of the RF pulse in the SSFP sequence and setting the calculated flip angle as the RF pulse sequence; and executing the imaging sequence having the RF pulse sequence of the calculated flip angle,
wherein the n-th flip angle $\phi(n)$ in the RF pulse sequence is expressed by:

$$\phi(n) = \alpha/2 \times (1 - \beta \times \cos(n\pi/N - \gamma)),$$

$$\beta^2 = (1 + \cos(\pi/N))/2,$$

$$\sin(\gamma) = \sin(\pi/N)/2\beta \text{ or } \cos(\gamma) = (1 + \cos(\pi/N))/2\beta.$$

* * * * *